United States Patent
Wu et al.

(10) Patent No.: US 6,838,296 B2
(45) Date of Patent: Jan. 4, 2005

(54) DEVICE AND METHOD FOR DETECTING ALIGNMENT OF DEEP TRENCH CAPACITORS AND ACTIVE AREAS IN DRAM DEVICES

(75) Inventors: Tie-Jiang Wu, Ilan (TW); Chien-Chang Huang, Banchiau (TW); Bo-Ching Jiang, Hualien (TW); Yu-Wei Ting, Taipei (TW)

(73) Assignee: Nanya Technology Corporation, Taoyuan (TW)

( * ) Notice: Subject to any disclaimer, the term of this patent is extended or adjusted under 35 U.S.C. 154(b) by 46 days.

(21) Appl. No.: 10/448,920

(22) Filed: May 29, 2003

(65) Prior Publication Data

US 2004/0033634 A1 Feb. 19, 2004

(30) Foreign Application Priority Data

Aug. 19, 2002 (TW) ........................................ 91118659 A (51) Int. Cl.$^7$ .............................................. H01L 21/66
(52) U.S. Cl. .............................. 438/14; 438/11; 438/18; 257/48; 365/201; 365/189.03
(58) Field of Search .............................. 438/14, 11, 18; 257/48; 365/201, 189.03

(56) References Cited

U.S. PATENT DOCUMENTS

| | | | | |
|---|---|---|---|---|
| 6,693,834 B1 | * | 2/2004 | Wu et al. | 365/201 |
| 2004/0029301 A1 | * | 2/2004 | Wu et al. | 438/14 |
| 2004/0076056 A1 | * | 4/2004 | Chang et al. | 365/201 |
| 2004/0082087 A1 | * | 4/2004 | Wu et al. | 438/17 |

\* cited by examiner

*Primary Examiner*—Matthew Smith
*Assistant Examiner*—Belur V Keshavan
(74) *Attorney, Agent, or Firm*—Quintero Law Office (57) ABSTRACT

A test device and method for detecting alignment of deep trench capacitors and active areas in DRAM devices. A quadrilateral active area is disposed in the scribe line region, with four equilaterals and four vertex angles. Parallel first and second deep trench capacitors are disposed in the quadrilateral active area. The first deep trench capacitor has a first surface aligned with a second surface of the second deep trench capacitor. The first and second vertex angles of the four vertex angles have a diagonal line essentially perpendicular to the first and second surfaces. The first and second vertex angles are a predetermined distance from the first surface and the second surface respectively.

10 Claims, 8 Drawing Sheets

DEVICE AND METHOD FOR DETECTING ALIGNMENT OF DEEP TRENCH CAPACITORS AND ACTIVE AREAS IN DRAM DEVICES

BACKGROUND OF THE INVENTION

1. Field of the Invention

The present invention relates to test devices, and more particularly, to a test device for detecting alignment of deep trench capacitors and active areas in DRAM devices, as well as a test method thereof.

2. Description of the Related Art

Figure 1:
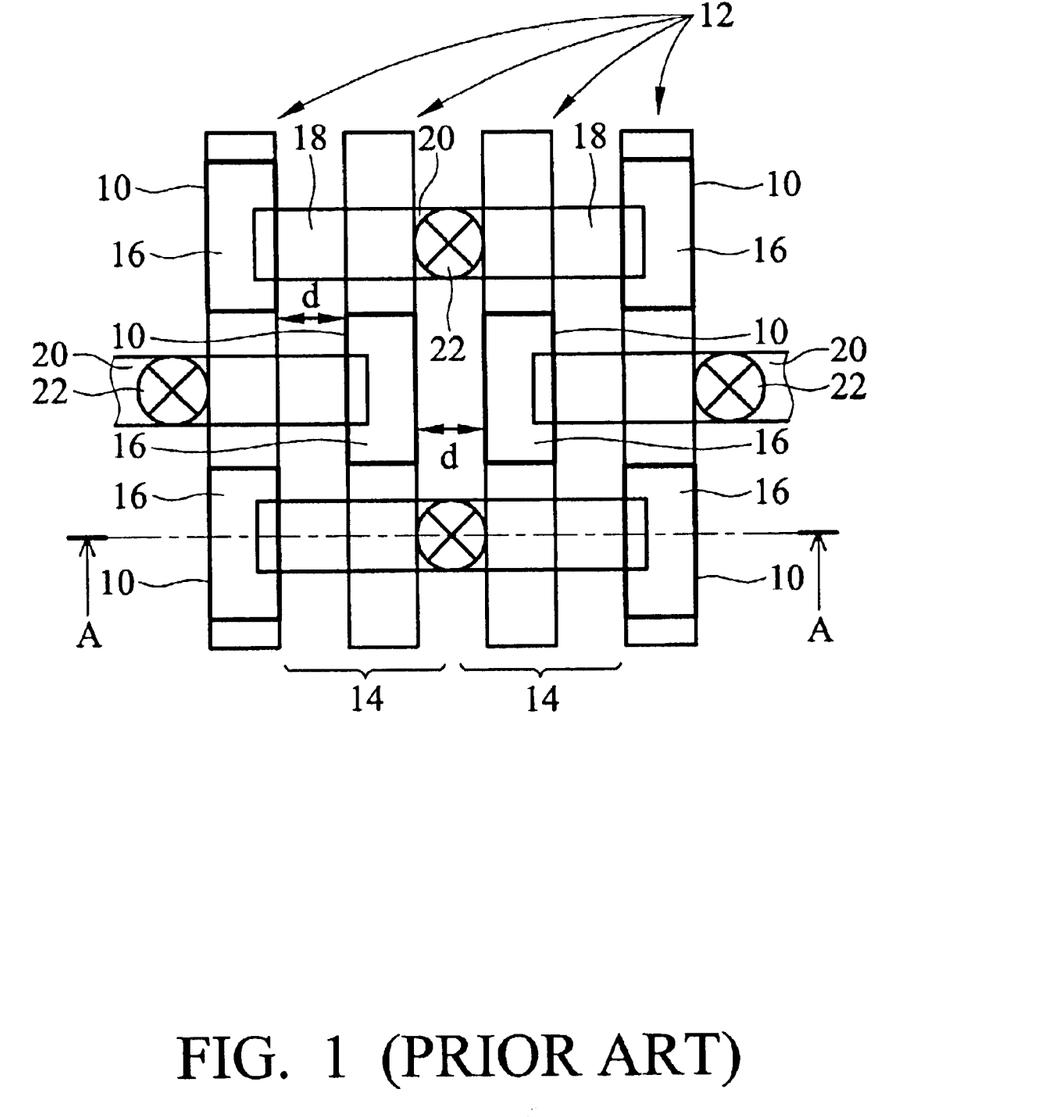
FIG. 1 is a layout of a conventional memory device with deep trench capacitors.

FIG. 1 is a layout of conventional deep trench capacitors in a memory device. Deep trench capacitors 10 are disposed under passing word lines. Transistors 14 are electrically coupled to the storage nodes 16 of the capacitors 10 through the diffusion regions 18. The diffusion regions 20 are connected to plugs 22 coupled to bit lines (not shown). The transistors 14 are driven by word lines 12, and the channels thereunder are conductive when appropriate voltages are applied thereto. Consequently, the current produced between the diffusion regions 18 and 20 may flow into or out of the storage nodes 16.

Figure 2:
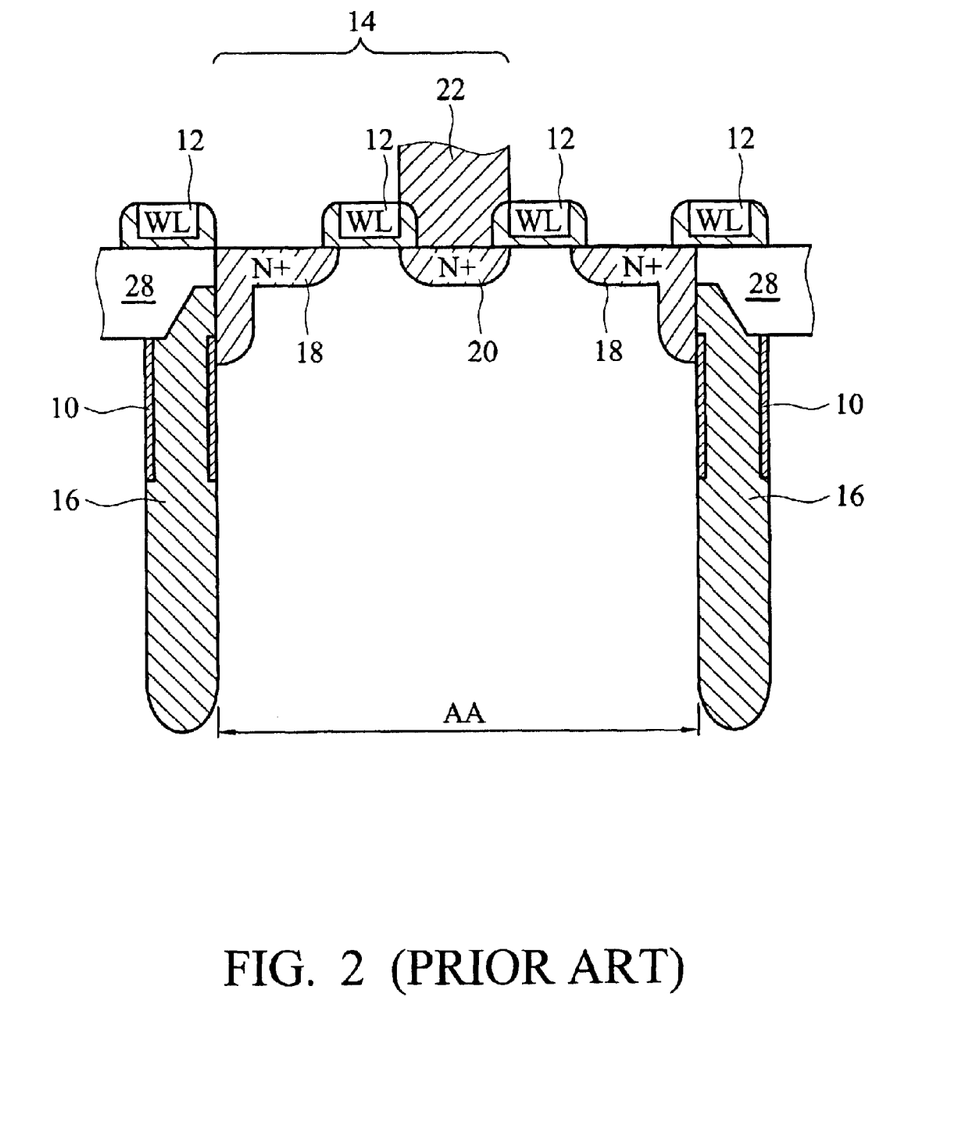
FIG. 2 is a cross section of FIG. 1.

FIG. 2 is a cross-section of FIG. 1. After the deep trench capacitors 10 are completely formed in the substrate, trench isolations are formed in the substrate and deep trench capacitors 10 to define active areas. The word lines 12 are then formed on the substrate, the diffusion regions 18 and 20 are formed in the active areas by word lines 12 during the implant process, and the diffusion regions 18 and 20 are located on both sides of the word lines 12. Finally, plugs 22 are formed on the diffusions 22. The adjacent memory cells may experience current leakage and cell failure, reducing process yield, if active area masks and deep trench capacitors are not aligned accurately.

Therefore, the process yield and reliability of the memory cells can be improved if alignment inaccuracy between the masks of active areas and the deep trench capacitors is controlled within an acceptable range.

SUMMARY OF THE INVENTION

It is therefore an object of the present invention to detect alignment of deep trench capacitors and active areas in DRAM devices.

According to the above mentioned objects, the present invention provides a test device and method for detecting alignment of deep trench capacitors and active areas in DRAM devices.

In the test device of the present invention, a quadrilateral active area is disposed in the scribe line region, wherein the quadrilateral active area has four equilaterals and four vertex angles. Parallel first and second deep trench capacitors are disposed in the quadrilateral active area. The first deep trench capacitor has a first surface aligned with a second surface of the second deep trench capacitor. The first and second vertex angles of the four vertex angles have a diagonal line essentially perpendicular to the first and second surfaces. The first and second vertex angles are a predetermined distance from the first surface and the second surface respectively.

According to the present invention, a method for detecting alignment of the deep trench capacitors and active areas in the DRAM devices includes the following steps. First, a wafer with at least one scribe line region and at least one memory region is provided. Then, a plurality of memory cells in the memory region and at least one test device in the scribe line region are formed simultaneously, wherein the memory cells have active areas and deep trench capacitors. A first junction resistance between the first surface of the first deep trench capacitor and the quadrilateral active area is detected. A second junction resistance between the second surface of the second deep trench capacitor and the quadrilateral active area is detected. Next, alignment of the first and second deep trench capacitors and the quadrilateral active area is determined according to the first junction resistance and the second junction resistance. Finally, alignment of the deep trench capacitors and active areas in the memory regions is determined according to alignment of the first and second deep trench capacitors and the quadrilateral active area of the test device.

BRIEF DESCRIPTION OF THE DRAWINGS

The present invention can be more fully understood by reading the subsequent detailed description and examples with reference made to the accompanying drawings, wherein:

FIGS. 6b and 6c are two cross sections of FIG. 6a; and

DETAILED DESCRIPTION OF THE INVENTION

Figure 3:
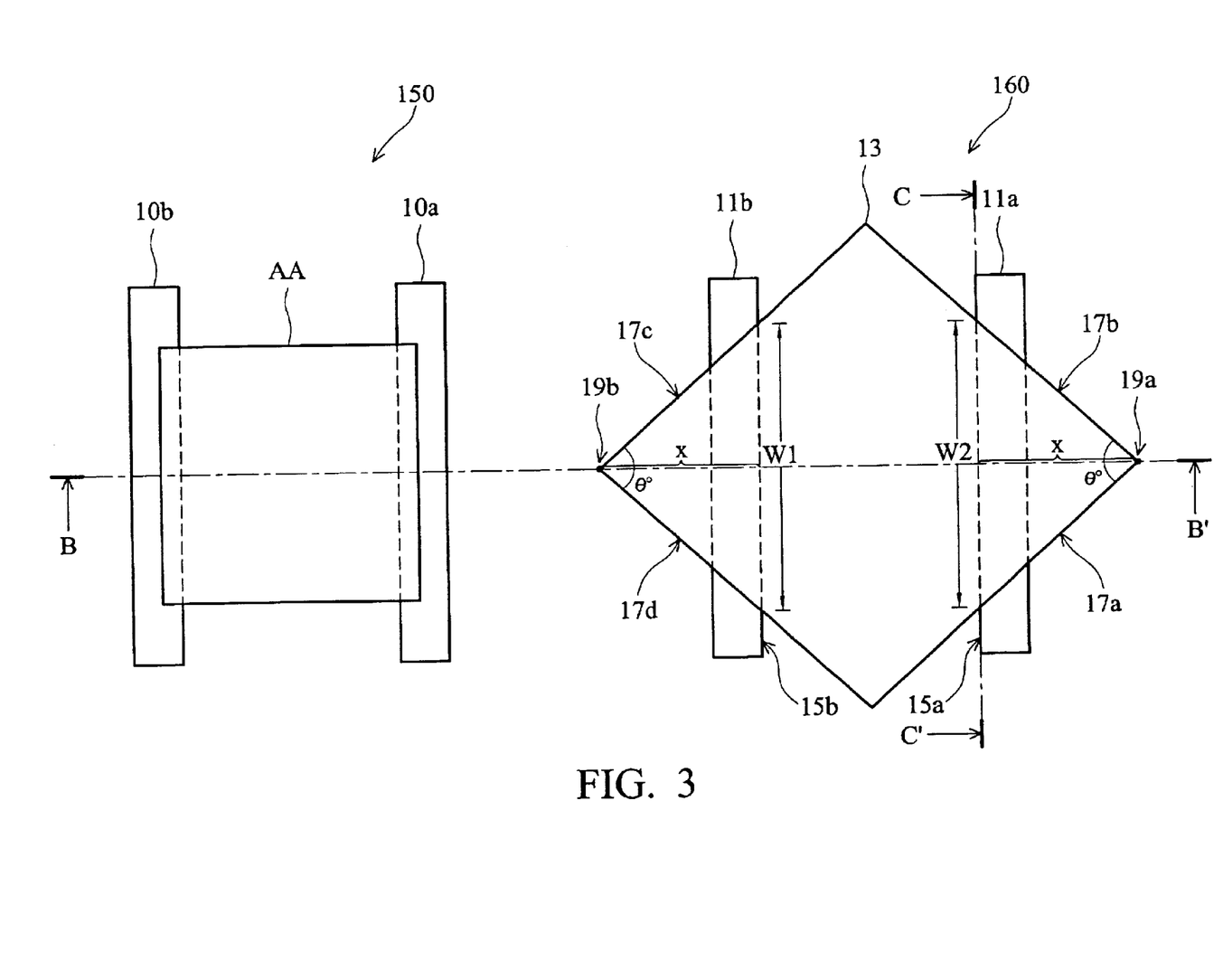
FIG. 3 is a diagram of the detection device according to the present invention.
Figure 4:
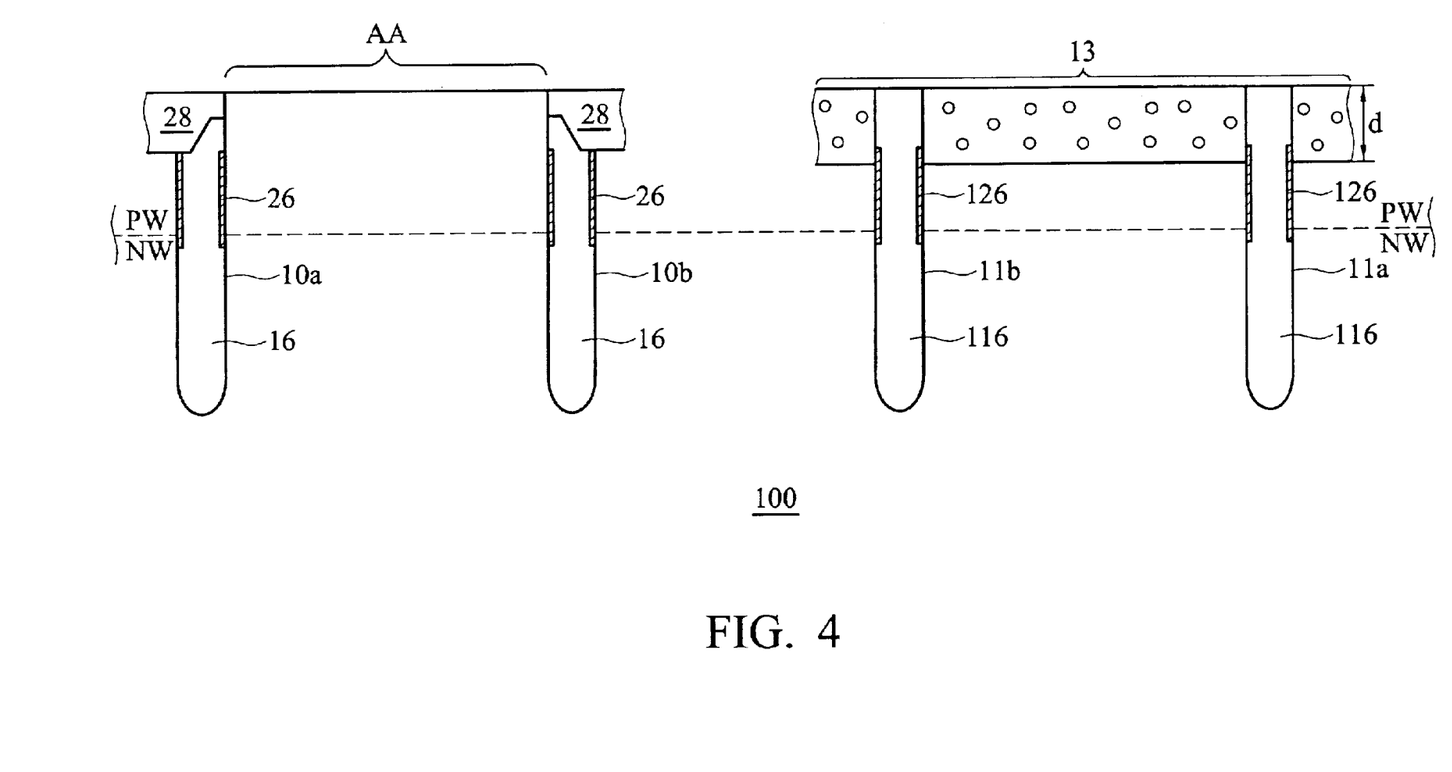
FIG. 4 is a cross section of FIG. 3.
Figure 5:
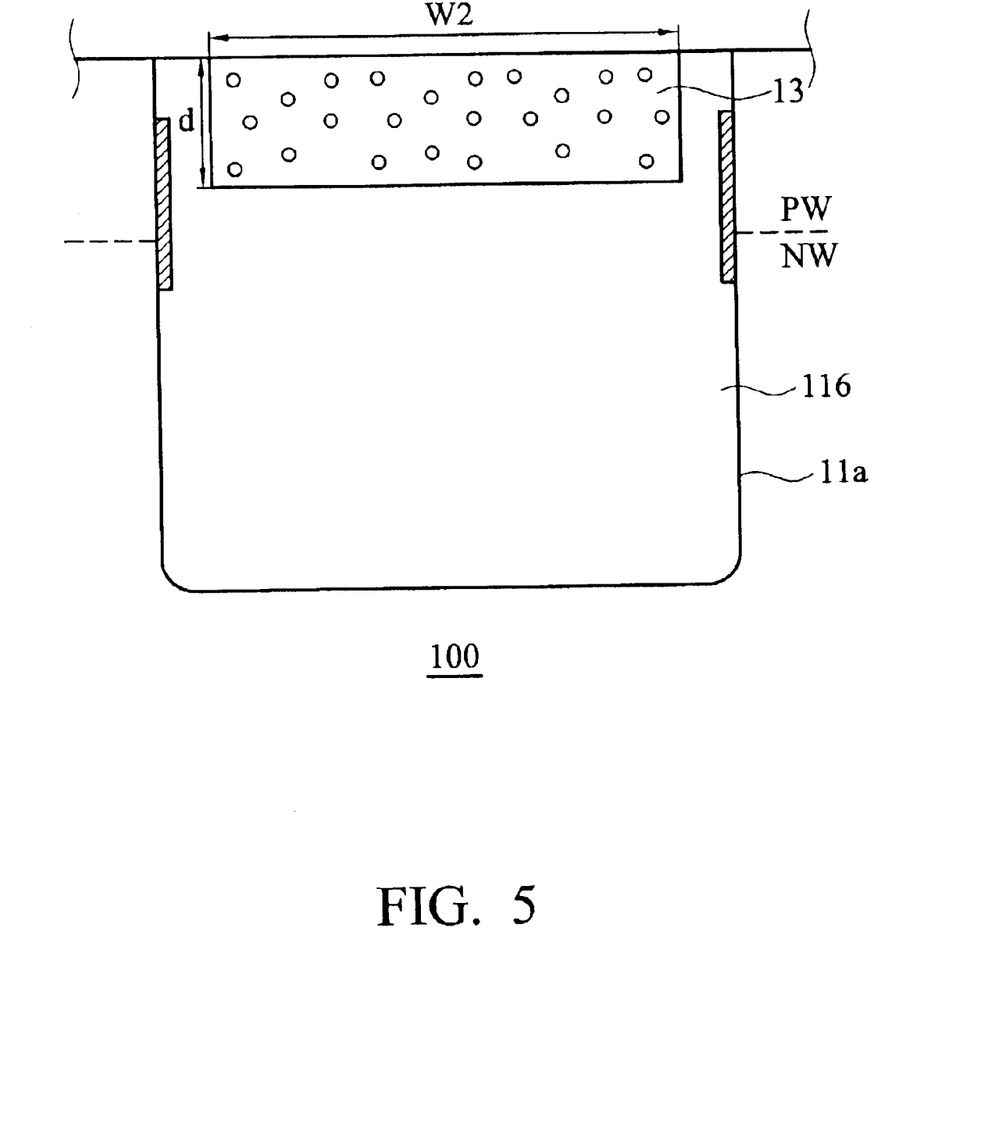
FIG. 5 is another cross section of FIG. 3.

FIG. 3 is a diagram of the device for detecting alignment of deep trench capacitors and active areas in DRAM device according to the present invention. FIG. 4 and FIG. 5 are two cross sections of FIG. 3. The test device detects the alignment of deep trench capacitors and active areas in DRAM devices, wherein at least one test device is disposed in a scribe line region 160 of a wafer (not shown).

A quadrilateral active area 13 is disposed in the scribe line region 160, and the quadrilateral active area 13 has four equilaterals (17a, 17b, 17c and 17 d) and four vertex angles. For example, the quadrilateral active area 13 can be rhomboid or square and formed by ion implantation.

Parallel first and second deep trench capacitors 11a and 11b are disposed in the quadrilateral active area 13. The first deep trench capacitor 11a has a first surface 15a aligned with a second surface 15b of the second deep trench capacitor 11a. The first and second vertex angles (19a and 19b) of the four vertex angles have a diagonal line (not shown) essentially perpendicular to the first and second surfaces (15a and 15b). The first vertex angle 19a is at a predetermined distance X from the first surface 15a. Similarly, the second vertex angle 19b is at a predetermined X distance from the second surface 15b. Further, the first vertex angle 19a and the second vertex angle 19b are both θ°.

Typically, resistance R is inversely proportional to the cross section area of a conductor, and the cross section of the conductor can be regarded as a product of width and length of the conductor. Resistance R is defined by the equations 1 and 2 as follows.

$$R = \rho \times \frac{L}{A} = \rho \times \frac{L}{(W \times d)}; \quad (1)$$

$$R = \frac{C}{W}; \quad (2)$$

Wherein ρ is resistivity of conductor, L is length of conductor, A is cross section of conductor, W is width of cross section of conductor, d is length of cross section of conductor, and C is $$\rho \times \frac{L}{d}.$$

Usually, a first junction resistance R1 between the first surface 15a of the first deep trench capacitor 11a and the quadrilateral active area 13 can be detected. A second junction resistance R2 between the second surface 15b of the second deep trench capacitor 11b and the quadrilateral active area 13 can be detected.

In the present invention, the first deep trench capacitor 11a and the second deep trench capacitor 11b are formed simultaneously with the same process conditions. Then, the active area 13 is formed in scribe line region to contact the first surface 15a of the first deep trench capacitor 11a and the second surface 15b of the second deep trench capacitor 11b. Thus, the first junction resistance R1 and the second junction resistance R2 can be obtained according to equations 1 and 2.

$$R1 = \frac{C}{W1}; \quad (3)$$

$$R2 = \frac{C}{W2}; \quad (4)$$

$$C \text{ is } \rho \times \frac{L}{d},$$

wherein ρ is resistivity of conductor, L is length of conductor, W1 and W2 are widths of cross section between the first and second surfaces (15a and 15b) and the active area 13, and d is ion implant depth of active area 13. Therefore, in the present invention, the first and second junction resistance R1 and R2 only depend on width W1 and W2 respectively because C is a constant composed of L, d and ρ.

As shown in FIG. 3, the width W1 and W2 of cross section between the first and second surfaces (15a and 15b) and the active area 13 can be presented by equations 5 and 6 respectively according to trigonometric function.

$$W1 = (X + \Delta X) \times 2 \, \tan\left(\frac{\theta}{2}\right); \quad (5)$$

$$W2 = (X - \Delta X) \times 2 \, \tan\left(\frac{\theta}{2}\right); \quad (6)$$

Wherein X+ΔX is distance between the first vertex angle 19a and the first surface 15a, and X+ΔX is distance between the second vertex angle 19b and the second surface 15b, and the equations 7 and 8 can be obtained according to the equations 3, 4, 5 and 6.

$$C = R1 \times (X + \Delta X) \times 2 \, \tan\left(\frac{\theta}{2}\right) = R2 \times (X - \Delta X) \times 2 \, \tan\left(\frac{\theta}{2}\right);$$

$$\Delta X = X \times \frac{(R2 - R1)}{(R1 + R2)};$$

Therefore, the alignment shift ΔX between first and second deep trench capacitors (11a and 11b) and the quadrilateral active area 13 can be obtained if the first junction resistance R1 and the second junction resistance R2 are measured. That is to say, the alignment shift ΔX between first and second deep trench capacitors (11a and 11b) and the quadrilateral active area 13 is zero when the first junction resistance R1 equals the second junction resistance R2.

Figure 6A:
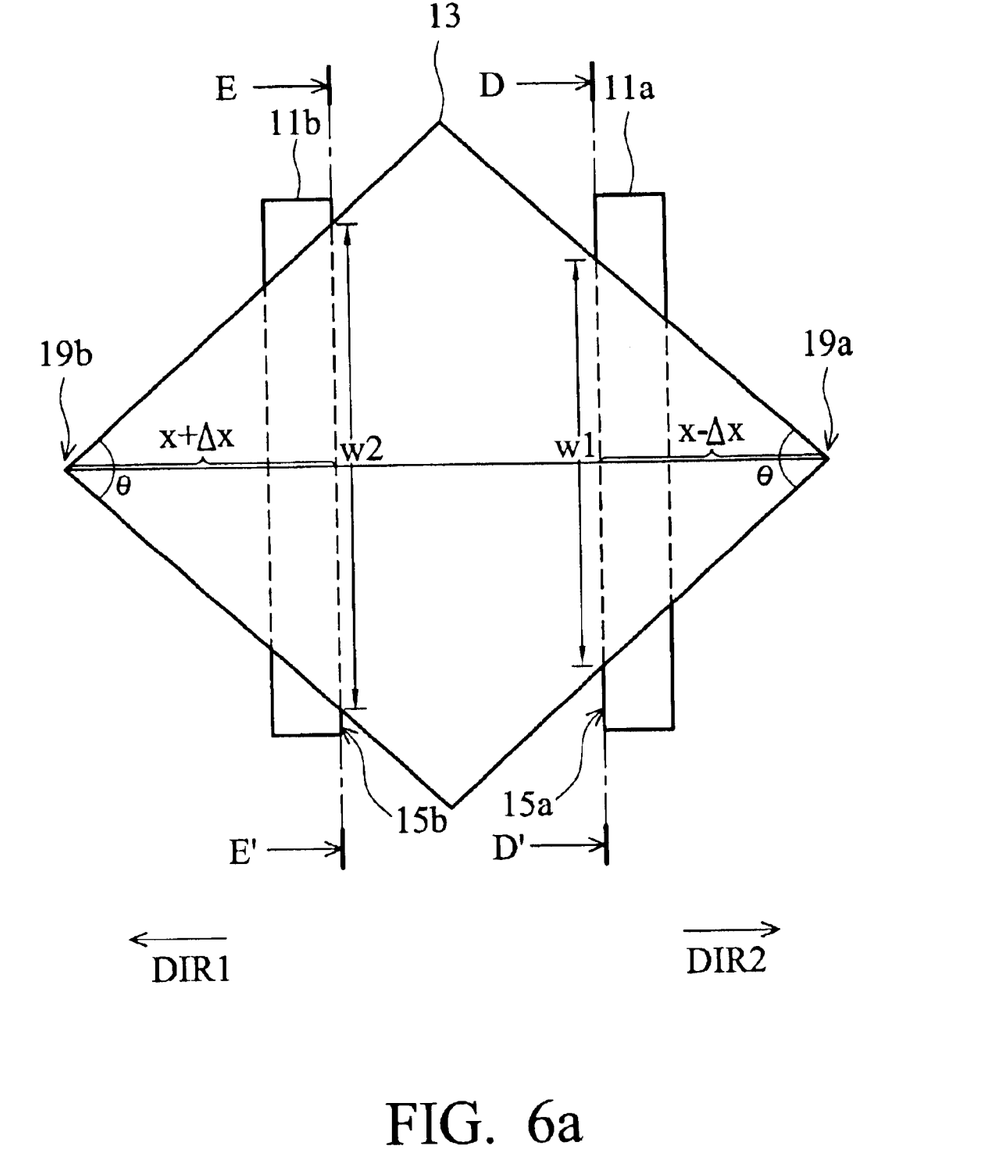
FIG. 6a is a diagram of the detection device with alignment shift according to the present invention.
Figure 6B:
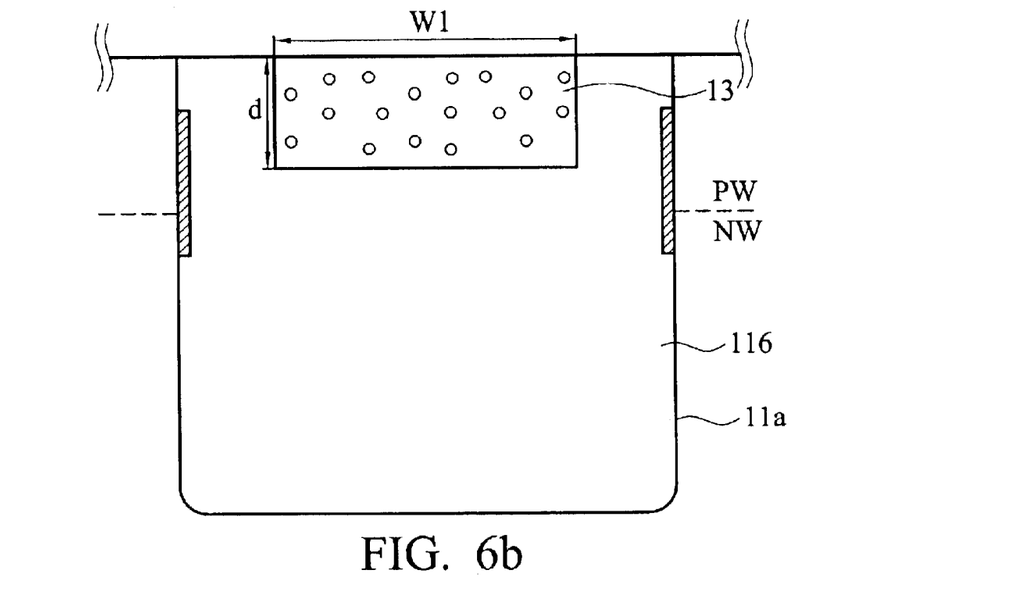
Figure 6C:
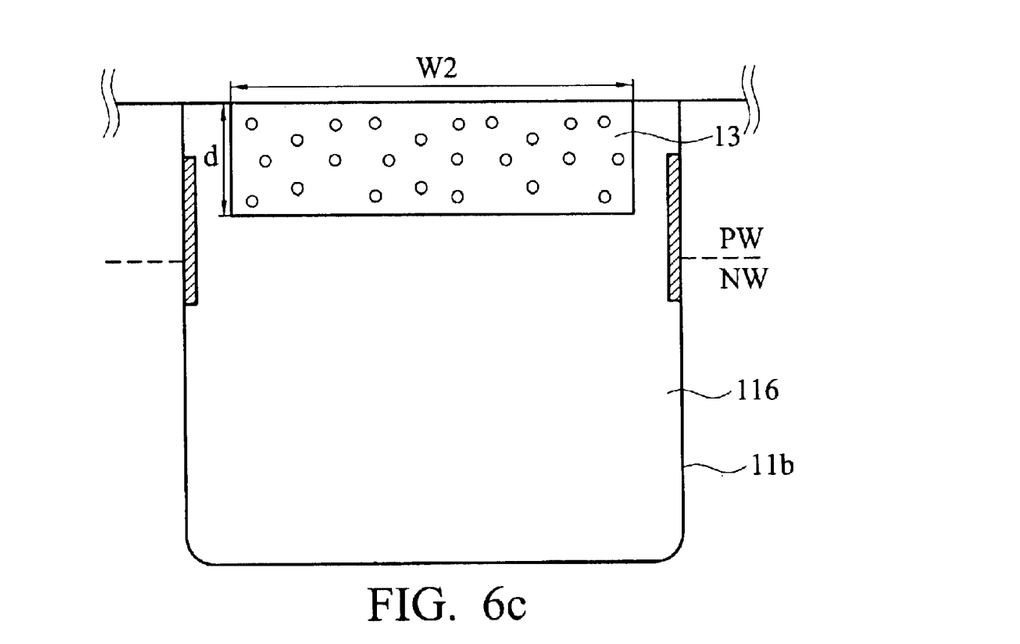

FIG. 6a is a diagram of the detection device with alignment shift according to the present invention, and FIGS. 6b and 6c are two cross sections of FIG. 6a.

With reference to FIGS. 6a–6c, the quadrilateral active area 13 is shifted by a distance ΔX along the direction DIR1 if the masks of the quadrilateral active area 13 and first and second deep trench capacitors (11a and 11b) have an alignment shift ΔX in the direction DIR1.

If this condition is met, the distance between the second vertex angle 19b and the second surface 15b of the second deep trench capacitor 11b is X+ΔX, and the distance between the first vertex angle 19a and the first surface 15a of the first deep trench capacitor 11a is X−ΔX. Further, the widths of cross section between the quadrilateral active area 13 and the first and second surfaces (15a and 15b) are W1 and W2 respectively, wherein W2 is longer than W1. In the present invention resistance is inversely proportional to widths of cross section between the quadrilateral active area 13 and the first and second surfaces (15a and 15b). Thus, the first junction resistance R1 is smaller than the second junction resistance R2 when W2 is longer than W1 according to the equations 3 and 4. Moreover, the alignment shift ΔX can be obtained by the equation 8.

On the contrary, the quadrilateral active area 13 is shifted by a distance ΔX along the direction DIR2 (not shown) if the masks of the quadrilateral active area 13 and first and second deep trench capacitors (11a and 11b) have an alignment shift ΔX in the direction DIR2.

If this condition is met, the distance between the second vertex angle 19b and the second surface 15b of the second deep trench capacitor 11b is X−ΔX, and the distance between the first vertex angle 19a and the first surface 15a of the first deep trench capacitor 11a is X+ΔX. Further, the widths of cross section between the quadrilateral active area 13 and the first and second surfaces (15a and 15b) are W1 and W2 respectively, wherein W1 is longer than W2. Thus, the first junction resistance R2 is smaller than the second junction resistance R1 when W1 is longer than W2 according to the equations 3 and 4. Moreover, the alignment shift ΔX can be obtained by the equation 8.

Figure 7:
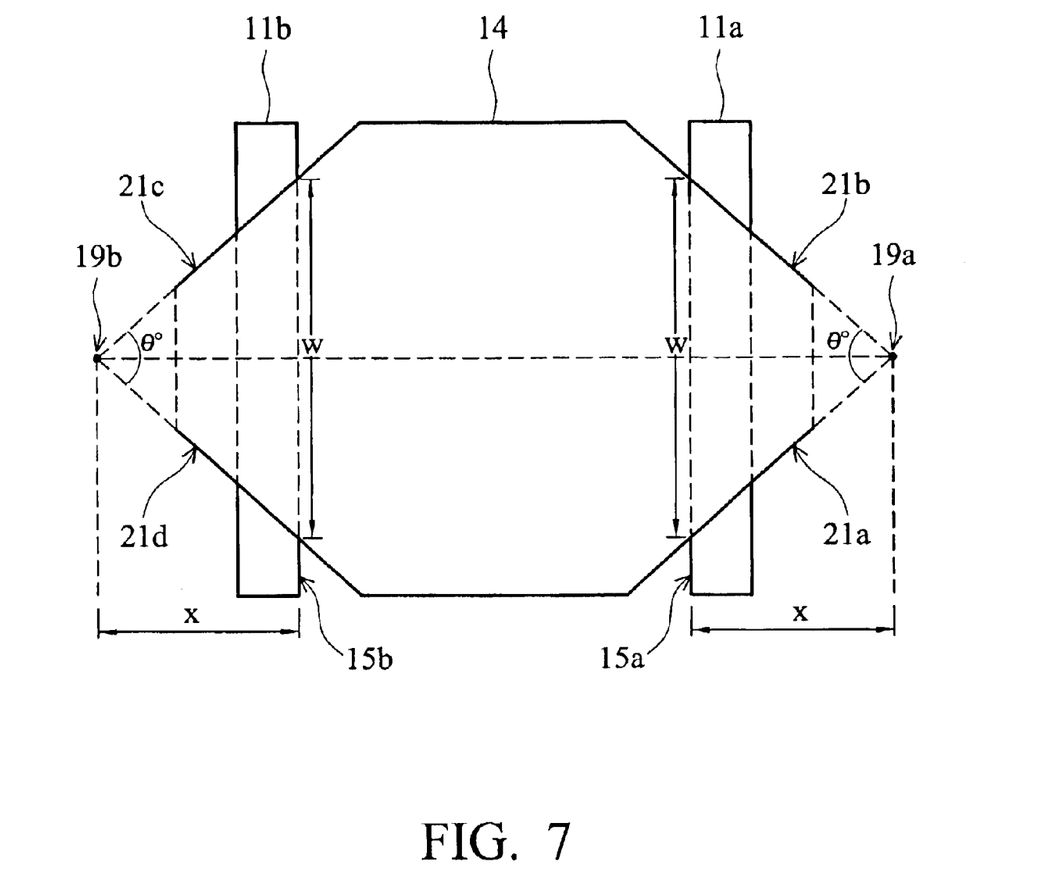
FIG. 7 is another aspect of the test device according to the present invention.

As shown in FIG. 7, the present invention also provides an aspect of the test device. In FIG. 7, a multilateral active area 14 is disposed in the scribe line region, and the multilateral active area 14 has at least four equilaterals 21a~21d. Parallel first and second deep trench capacitors 11a and 11b are disposed in the multilateral active area 14. The first deep trench capacitor 11a has a first surface 15a aligned with a second surface 15b of the second deep trench capacitor 11b. The extended lines of the two equilaterals 21a and 21b form a first vertex angle 19a, extended lines of the equilaterals 21c and 21d form a second vertex angle 19b. The first and second vertex angles (19a and 19b) have a diagonal line essentially perpendicular to the first surface 15a and the second surface 15b. The first and second vertex angles (19a and 19b) are a predetermined distance X from the first and second surfaces (15a and 15b) respectively. Similarly, the alignment shift ΔX between first and second deep trench capacitors (11a and 11b) and the multilateral active area 14 can be obtained if the first junction resistance R1 and the second junction resistance R2 are measured. That is to say, the alignment of first and second deep trench capacitors (11a and 11b) and the multilateral active area 14 is abnormal when the first junction resistance R1 is not equal to the second junction resistance R2. Also, the alignment shift ΔX can be obtained by the equation 8.

The present invention also provides a method for detecting alignment of deep trench capacitors and active areas in DRAM device. In the method of the present invention, a wafer with at least one scribe line region 160 and at least one memory region 150 is provided.

A plurality of memory cells in the memory region 150 and at least one test device in the scribe line region 160 are formed simultaneously, wherein the memory regions have deep trench capacitors and active areas as shown in FIG. 1~FIG. 3. The structure of the test device is shown in FIG. 3~FIG. 5. The deep trench capacitors in the memory regions and the first and second deep trench capacitors (11a and 11b) in the test device are formed by the same mask and the same process. The active areas in the memory regions and quadrilateral active area 13 in the test device are formed by the same mask and the same process.

After that, a first junction resistance R1 between the first surface 15a of the first deep trench capacitor 11a and the quadrilateral active area 13 is determined. A second junction resistance R2 between the second surface 15b of the second deep trench capacitor 11b and the quadrilateral active area 13 is determined. Then, alignment of the quadrilateral active area 13 and the deep trench capacitors 11a and 11b of the test device is determined according to whether the first resistance R1 is equal to the second resistance R2.

The memory regions and the test device may have the same alignment shift between the deep trench capacitors and active areas due to use of the same masks and the same process. Thus, alignment of deep trench capacitors and active areas in memory regions can be obtained according to alignment of the quadrilateral active area 13 and the deep trench capacitors (11a and 11b) of the test device. The alignment shift between deep trench capacitors and active areas in the memory regions can also be obtained according to the equation 8.

In the present invention, the test device is disposed in the scribe line region and is formed by the same masks and process as the deep trench capacitors and active areas in the memory regions simultaneously. Therefore, the test device disposed in the scribe line region can detect the alignment shift between the deep trench capacitors and active areas in the memory regions because the test device and the memory regions may have the same alignment shift when masks are aligned. Further, in the present invention the test device is disposed in the scribe line region to avoid occupying layout space in memory regions.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A test device for detecting alignment of deep trench capacitors and active areas in DRAM devices, wherein the test device is disposed in a scribe line region of a wafer, comprising:
    a quadrilateral active area disposed in the scribe line region, and having four equilaterals and four vertex angles; and
    parallel first and second deep trench capacitors disposed in the quadrilateral active area, the first deep trench capacitor having a first surface aligned with a second surface of the second deep trench capacitor; wherein the first and second vertex angles of the four vertex angles have a diagonal line essentially perpendicular to the first and second surfaces, and the first and second vertex angles are at a predetermined distance from the first surface and the second surface respectively.

2. The test device as claimed in claim 1, wherein the quadrilateral active area is rhomboid.

3. A test device for detecting alignment of deep trench capacitors and active areas in DRAM devices, wherein the test device is disposed in a scribe line region of a wafer, comprising:
    a multilateral active area disposed in the scribe line region, having at least four equilaterals; and
    parallel first and second deep trench capacitors disposed in the multilateral active area, the first deep trench capacitor having a first surface aligned with a second surface of the second deep trench capacitor; wherein extended lines of two of the four equilaterals form a first vertex angle, extended lines of the other two of the four equilaterals form a second vertex angle, the first and second vertex angles have a diagonal line essentially perpendicular to the first surface and the second surface, and the first and second vertex angles are at a predetermined distance from the first and second surfaces respectively.

4. A method for detecting alignment of deep trench capacitors and active areas in DRAM devices, comprising:
    providing a wafer with at least one scribe line region and at least one memory region;
    forming a plurality of memory cells in the memory region and at least one test device in the scribe line simultaneously, wherein the memory cells have active areas and deep trench capacitors, the test device including:
        a quadrilateral active area disposed in the scribe line region, and having four equilaterals and four vertex angles; and
        parallel first and second deep trench capacitors disposed in the quadrilateral active area, the first deep trench capacitor having a first surface aligned with a second surface of the second deep trench capacitor; wherein the first and second vertex angles of the four vertex angles have a diagonal line essentially perpendicular to the first surface and the second surface, and the first and second vertex angles are at a predetermined distance from the first and second surfaces respectively;
    detecting a first junction resistance between the first surface of the first deep trench capacitor and the quadrilateral active area;
    detecting a second junction resistance between the second surface of the second deep trench capacitor and the quadrilateral active area;
    determining alignment of the first and second deep trench capacitors and the quadrilateral active area according to the first junction resistance and the second junction resistance; and determining alignment of the deep trench capacitors and active areas in the memory regions according to alignment of the first and second deep trench capacitors and the quadrilateral active area of the test device.

5. The method as claimed in claim 4, wherein the alignment of the first and second deep trench capacitors and the quadrilateral active area is abnormal when the first junction resistance is not equal to the second junction resistance.

6. The method as claimed in claim 4, further comprising a step of determining alignment shift ($\Delta X$) of the first and second deep trench capacitors and the quadrilateral active area according to the first junction resistance, the second junction resistance, and the predetermined distance between first and second vertex angles and the first and second surfaces respectively.

7. The method as claimed in claim 6, wherein the alignment shift ($\Delta X$) is determined by an equation:

$$\Delta X = X \times \frac{(R2 - R1)}{(R1 + R2)};$$

wherein X is the predetermined distance between first vertex angle and the first surface and between the second vertex angle and the second surface; R1 is the first junction resistance between the first deep trench capacitor and the quadrilateral active area; and R2 is the second junction resistance between the second deep trench capacitor and the quadrilateral active area.

8. The method as claimed in claim 4, wherein the quadrilateral active area is formed by ion implantation.

9. The method as claimed in claim 4, wherein the quadrilateral active area is rhomboid.

10. The method as claimed in claim 4, wherein the quadrilateral active area is square.

\* \* \* \* \*